(12) United States Patent
Barnett

(10) Patent No.: US 6,320,155 B1
(45) Date of Patent: Nov. 20, 2001

(54) PLASMA ENHANCED WIRE BONDER

(75) Inventor: Ronald J. Barnett, Santa Rosa, CA (US)

(73) Assignee: GeoMat Insights, LLC, Wilmington, DE (US)

( * ) Notice: Subject to any disclaimer, the term of this patent is extended or adjusted under 35 U.S.C. 154(b) by 0 days.

(21) Appl. No.: 09/481,753

(22) Filed: Jan. 11, 2000

(51) Int. Cl.[7] .................................................. B23K 11/00
(52) U.S. Cl. ........................ 219/121.46; 219/121.45; 219/121.59; 219/85.18; 228/227
(58) Field of Search ........................... 219/121.59, 121.4, 219/85.1, 85.18, 121.43, 121.41, 121.37, 121.38; 228/206, 42, 205, 211, 220, 227; 156/345

(56) References Cited

U.S. PATENT DOCUMENTS 5,831,238 * 11/1998 Takuya et al. ................... 219/121.59
6,158,648 * 12/2000 Mori et al. ............................ 228/206

* cited by examiner

Primary Examiner—Mark Paschall
(74) Attorney, Agent, or Firm—Jessica Clement

(57) ABSTRACT

A method and apparatus for simultaneously cleaning and bonding a wire to a bonding surface is presented. In accordance with the invention, a gas is energized to form a plasma, which is then directed in a directional pressurized flow at the wire and bonding surface to form a dynamic plasma cleaning chamber bubble around the portion of the wire and bonding surface that are to be bonded together, and then the respective portions of the wire and bonding surface are bonded together within the plasma cleaning chamber bubble.

20 Claims, 4 Drawing Sheets

PLASMA ENHANCED WIRE BONDER

FIELD OF THE INVENTION

The present invention pertains generally to plasma enhanced bonding of metallic materials, and more particularly, to a method and apparatus for using hot plasma gas to simultaneously heat, clean, and activate the bonding of surfaces of metals both immediately before bonding and as the surfaces are fused together.

BACKGROUND OF THE INVENTION

Wire bonding is a technique used in the semiconductor industry to connect different integrated circuit (IC) pads together via wires. Current wire bonding methods fall into one of three predominant categories: thermocompression, ultrasonic, and thermosonic bonding. Each wire bonding method involves a three-step process to bond the wire to a surface. The first step involves that application of force which impels the atoms of the metal wire to within a close enough distance to the atoms of the pad to allow diffusion bonding to take place, and also deforms the metal wire against the pad to create a larger bonding surface, resulting in a larger bonding footprint. The second step involves the application of bonding energy to the atoms of the wire and pad. The bonding energy is thermal energy when using thermocompression, ultrasonic energy when using the ultrasonic bond method, and a combination of thermal and ultrasonic energies when using the thermosonic methods. The third step involves the passage of an appropriate amount of time to allow the two surfaces to fuse together.

Faster bonding has not heretofore been achieved due to the inability to prevent contaminants from adhering to the bond site surfaces. Surface contamination is known by experts in the wire bonding field to cause poor wire bond adhesion, resulting in less robust bonds and therefore less reliable interfaces. Accordingly, much effort has gone into cleansing the surfaces of the metals to be wire bonded. Current wire bonding processes now include a plasma bond pad cleaning prior to wire bonding in order to enhance the bondability of the wire bond surfaces. Plasma cleaning is a technique involving the use of gas plasma to remove organic contaminants from surfaces. By removing surface contamination, plasma cleaning increases the bonding or adhesive properties of the bondsite surface.

A plasma is a collection of positive, negative, and neutral particles in which the density of the negatively charged particles is equal to the density of the positively charged particles. When an energetic electron strikes a neutral gas molecule, it can cause dissociation and form free radicals and ions. The free radicals cause chemical reactions for destroying contaminants. For example, with oxygen, the dissociation process produces the free radical atomic oxygen (O). This reactive species has enough energy to break a carbon-carbon bond.

Prior art plasma cleaning involves placing the pieces to be bonded into a plasma chamber, removing air from the chamber to create a vacuum, introducing a gas or gaseous mixture into the chamber, and applying energy to the chamber to produce the plasma. In the presence of the plasma, organic contaminants on the bondsite surfaces are converted to carbon monoxide, carbon dioxide, water vapor, and/or other gasses, which are pulled out of the plasma chamber by a vacuum pump. After a suitable amount of time, the gas flow and energy are shut off, and the chamber is then purged with a nonreactive gas, such as nitrogen, to remove all traces of volatile compounds. Finally, the chamber is returned to atmospheric pressure. A cleaning cycle usually lasts from between 30 seconds to 15 minutes and is largely a function of the workpiece loading in the plasma chamber.

The current methodologies for plasma cleaning of wire bond surfaces is problematic. First, as soon as the components exit the cleaning chamber, they are immediately exposed to surface recontamination due to the organic particles in the air. In addition, the separate plasma cleaning chamber and equipment, coupled with the long amount of time required to set up and execute the cleaning process, is quite costly. Accordingly, it would be desirable to have a method and apparatus that allows expedient plasma cleaning of wire bond surfaces without the use of a separate expensive cleaning chamber.

SUMMARY OF THE INVENTION

The present invention is a novel method and apparatus for performing plasma cleaning of wire bond surfaces at the time the bonding occurs. The invention effectively generates a plasma bath, or "bubble", around the bond site which performs the simultaneous functions of heating, cleaning, and activating the bonds of the surfaces of the metals that are to be fused together.

In accordance with the method of the invention, an energizing circuit ionizes a gas to form a plasma, which is directed in a directional pressurized flow at the wire and bonding site surface to form a dynamic plasma cleaning chamber bubble around the portion of the wire and the bonding site surface that are to be bonded together. The dynamic plasma cleaning chamber bubble is maintained at the bond site prior to and during the actual bonding of the surfaces in order to clean and prevent recontamination of the site during the bonding process.

In one embodiment, the plasma enhanced wire bonder in accordance with the invention includes a bonding device that performs the bonding of the wire to the bond site surface. The bonder also includes a plasma gun which applies a pressurized directional flow of plasma directed at the wire, the bond site surface, and the portion of the bonding device that comes in contact with either the wire or bond site surface. Preferably, an energizing circuit is included to energize the gas supplied to the plasma gun to generate the plasma. In the preferred embodiment, the gas is argon or a mixture of argon and oxygen. The gas is energized via direct current voltage or high frequency alternating current (i.e., radio frequency, RF). Preferably, the plasma enhanced wire bonder also includes a temperature detector which senses the temperature of the bond site, and a controller which adjusts the energizing circuit to adjust the plasma temperature to maintain the bond site temperature within a predetermined temperature range.

The present invention describes a novel technique that cleans the metal surfaces as they are bonded to eliminate any contaminants from being introduced into the final bond, thereby improving the wire bond adhesion. The invention may also allow materials to be bonded together that prior to the present invention were difficult to bond due to compounds formed at the bond site, which resulted in weaker bonds. In addition to the above-named advantages, the temperature of the plasma/hot gas is high enough that the bonding device (e.g., wedge or ball bonder) need not include a heater. The invention essentially provides "localized" heating within the area of the dynamic plasma cleaning chamber bubble, which reduces the risk of accidentally unsoldering other wire bonds on the device being bonded.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A method and apparatus for plasma enhanced wire bonding that supports the simultaneous heating, cleaning, and bond activation of surfaces of metals that are to be fused together while maintaining the entire bond site in a dynamic plasma cleaning chamber bubble of clean argon is described in detail hereinafter. Although the invention is described using certain preferred bonding materials, gaseous plasmas, and wire bond apparatus configuration, it is to be understood that other bonding materials and gasses having similar characteristics and other apparatus configurations that achieve the same function are intended to be covered by the claims appended hereto.

Figure 1:
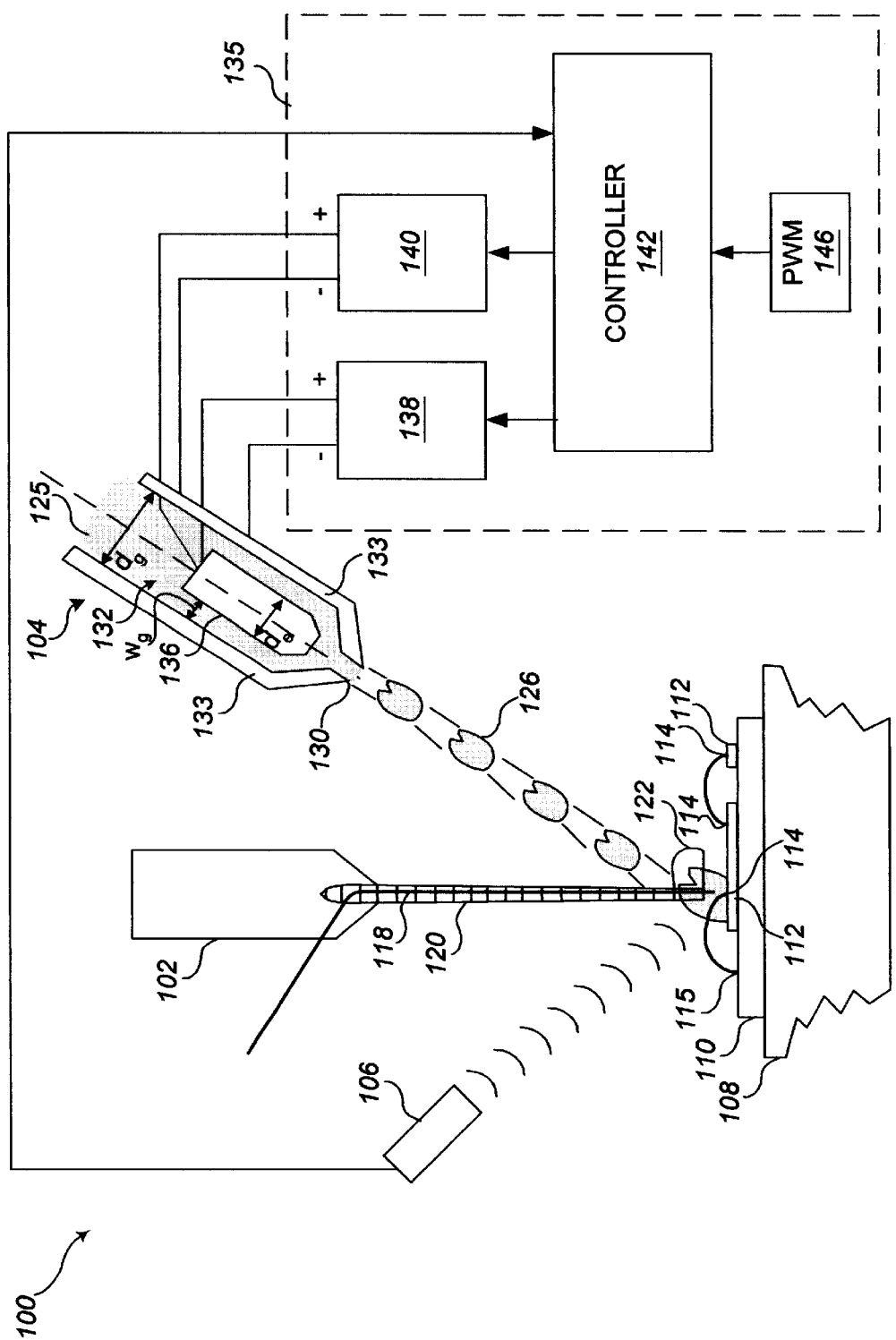
FIG. 1 is a block diagram of a plasma wire bonder implemented in accordance with the invention.

Turning now to FIG. 1, there is shown a block diagram of a plasma enhanced wire bonder 100 implemented in accordance with the invention. Plasma enhanced wire bonder 100 includes bonding device 102, plasma gun 104, and infrared detector 106. Bonding device 102 is heaterless for reasons described hereinafter. Plasma enhanced wire bonder 100 operates to bond metal surfaces together. Preferably, plasma enhanced wire bonder 100 includes a table 108 which supports a microcircuit substrate 110 containing metal pads to be bonded. Substrate 110 may be a printed circuit (PC) board, a ceramic circuit, a sapphire circuit, a quartz circuit, a glass circuit, or a substrate made of any other of a variety of well-known substrate materials. In the illustrative embodiment, substrate 110 comprises one or more integrated circuits (IC's) 112 comprising pads 114 that need to be bonded to pads 115 on the substrate 110 or to other IC pads 114.

In the illustrative embodiment, bonding device 102 is a wedge bonder; however, bonding device 102 could also be implemented with other types of bonding devices that serve to bond a wire to a bond site pad, for example a ball bonder. Such bonding devices are well-known in the art and are intended to be included within the scope of the bonding device 102. In the illustrative embodiment, wedge bonder 102 comprises a tungsten wedge tip 122, heated by ceramic heater, having a hole therein through which a thin wire 118 is threaded and output to a capillary tip 120 of the wedge 102, which is directed at a bonding site 144, 115 (i.e., the site where the bonding is to occur). In the preferred embodiment, wire 118 is gold or aluminum. The present invention may allow bonding of other metal systems as well, such as copper wires to copper pads.

Plasma gun 104 comprises a hollow coaxial bore 132 through which a steady stream of argon gas is supplied by an external source (not shown). In the preferred embodiment, gas 125 is a noble gas such as argon, which may optionally be a gaseous mixture such as 95% argon with 5% oxygen. Gas 125 is output onto the surface of the bonding site as hereinafter described, forming a dynamic plasma cleaning chamber bubble around the bonding site. Gas 125 is pulse stimulated by an energizing circuit 135, which ionizes the gas to form hot plasma. Bore 132 is shaped aerodynamically to shoot a laminar stream of the hot plasma, approximately 40 mil in diameter, through a tip 130 at the end opposite of the plasma gun 104 in a directional pressurized flow toward the bonding site. The ions of the hot plasma recombine across the distance between the plasma gun tip 130 and the bonding site to form hot gas. The recombination is optional and is desirable only in the case of wire bonding electronic circuits to ensure that charge build-up does not occur on the surface of the device being bonded. The effect of the plasma and the hot reactant gasses (such as $H_2$ or $O_2$) is that the bonding site is simultaneously heated and cleaned immediately before and during the bonding step as described in more detail hereinafter.

In the preferred embodiment, gas 125 flows continuously through the bore 132 of the plasma gun 104 under the control of an external source (not shown) at the end of the coaxial bore opposite that of the tip 130. Gas 125 is energized to form hot plasma by an energizing circuit 135. Energizing circuit 135 generates the energy to create the plasma, and is preferably generated either by a direct current voltage or by radio frequency in the range of 1 KHz to 100 GHz.

In the illustrative embodiment, energizing circuit 135 is implemented using a high voltage DC circuit 138 that sparks the initial ionization of the argon gas 125 within the plasma gun 104. A secondary low voltage DC circuit 140 continues the ionization of the gas once the initial ionization spark begins. The ionization of the argon gas 125 occurs periodically to form a periodic output stream of hot pulses (or "bullets") of plasma. The temperature of the bond site, capillary wedge tip 120, and wire 118 are monitored using infrared detector 106. Infrared detector 106 is coupled to controller 142 which uses the data received from detector 106 to maintain the temperature at the desired level (typically approximately 180°).

Figure 2:
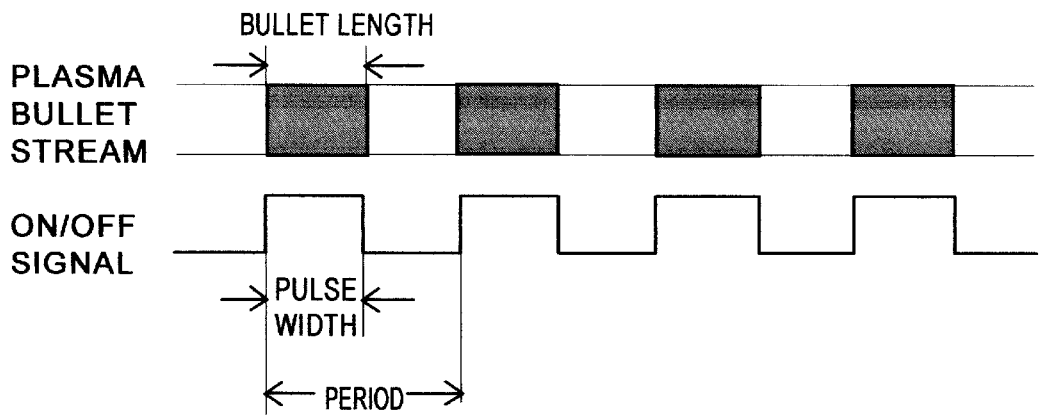
FIG. 2 is a graph illustrating the relationship between the frequency and duty cycle of the energizing circuit and the frequency and length of the plasma bullets.

The plasma bullets are formed in the preferred embodiment by turning on and off the energizing circuit 135. The repetition rate and length of the plasma bullets are controlled via controller 142, which preferably uses a pulse width modulator 146 to control the duty cycle of the energizing circuit 135 to maintain a peak energy that is high enough to guarantee cleansing of the bond surfaces. In the preferred embodiment, the frequency and length of plasma bullets in the plasma stream is adjusted by design to fit the application. FIG. 2 is a graph illustrating the relationship between the frequency and duty cycle of the ON/OFF signal that controls the energizing circuit 135 and the frequency and length of the plasma bullets. As shown, the length of the plasma bullet is proportional to the width of the ON/OFF pulse in the on position. The frequency of the plasma bullets is directly related to the period of the ON/OFF signal.

Figure 3:
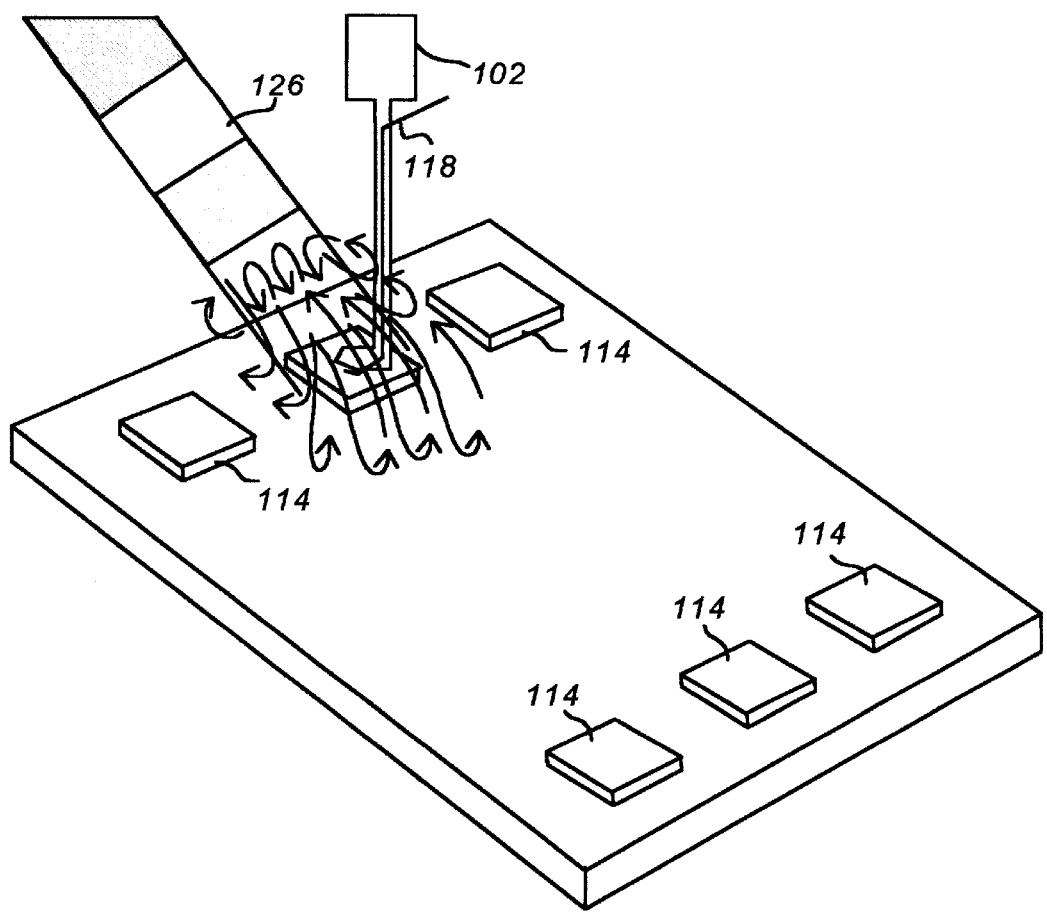
FIG. 3 is a perspective view of a wire bonder implemented in accordance with the invention illustrating the formation of a dynamic cleaning chamber bubble around the bond site.

It will be appreciated by those skilled in the art that since the plasma gun is aimed at the bonding site, the argon bath, and therefore the cleaning, occurs only at the site of the surfaces to be bonded. This eliminates unnecessary cleaning of the rest of the circuitry. The gaseous stream of argon acts as a dynamic cleaning chamber or "bubble" around the bond site, as illustrated in FIG. 3, so that once the surfaces to be cleaned are cleaned, the argon stream remains until the bonding is complete so that the outward flowing pressure from the gaseous bubble forces air out of the area of the bubble chamber and prevents air from re-entering the area enclosed within the bubble—thus, the bonding surfaces do not get recontaminated during the actual bonding. In operation, when the hot plasma bullets come in contact with the surfaces to be bonded, they perform cleaning by performing one or more of the following actions, including vaporization, reduction, or oxidation, depending on the gas or gaseous mixture chosen for the application.

When the gas or gaseous mixture contains a noble gas, such as argon, the noble gas molecules do not easily recombine with molecules containing other elements. Thus, when the noble gas molecules are heated to a high enough energy, the noble gas molecules operate only to break the bonds between surface contaminant molecules and the bond site molecules due to the force of the hot (and therefore high speed) noble gas molecules when colliding with the surface contaminant molecules, causing the surface contaminant molecules to break away from the bond site surface into free air. This operation is termed herein "vaporization".

When the gas or gaseous mixture contains a more recombinant gas, such as hydrogen ($H_2$), the recombinant gas molecules easily recombine with surface contaminant molecules. Thus, when the recombinant gas combines with surface contaminant molecules, the surface contaminants are converted, or reduced, to another form. For example, if the gas is a mixture of argon and hydrogen, and the surface contaminants are silicon dioxide ($SiO_2$), the hydrogen combines with the oxygen molecules to form water ($H_2O$) and oxygen, thereby reducing the surface contaminants to pure silicon (Si). This process is termed herein "reduction". The remaining surface contaminants can be vaporized by the noble argon gas molecules in the gaseous mixture as described above.

When the gas or gaseous mixture contains oxygen ($O_2$), the oxygen can combine with the surface contaminant molecules to "oxidize" or essentially "burn" away any contaminants present on the surfaces such as aluminum oxide.

In addition to cleaning, the plasma/hot gas 125 that forms the bubble chamber around the bond site simultaneously activates the bonds of the metal surfaces of the bond site so that surface atoms of both the wire and the pad/bond site are activated to allow the two different metals to more easily fuse together. In particular, the hot gas breaks the surface bonds of each of the respective bonding surfaces so that they are ready to rebond with the molecules of the other surface.

It will be appreciated that this novel technique of simultaneously cleaning the surfaces, activating the bonds of the surface atoms, and preventing contaminants from recontaminating the bonding surfaces allows metals that heretofore could not be bonded together to be bonded.

Figure 4:
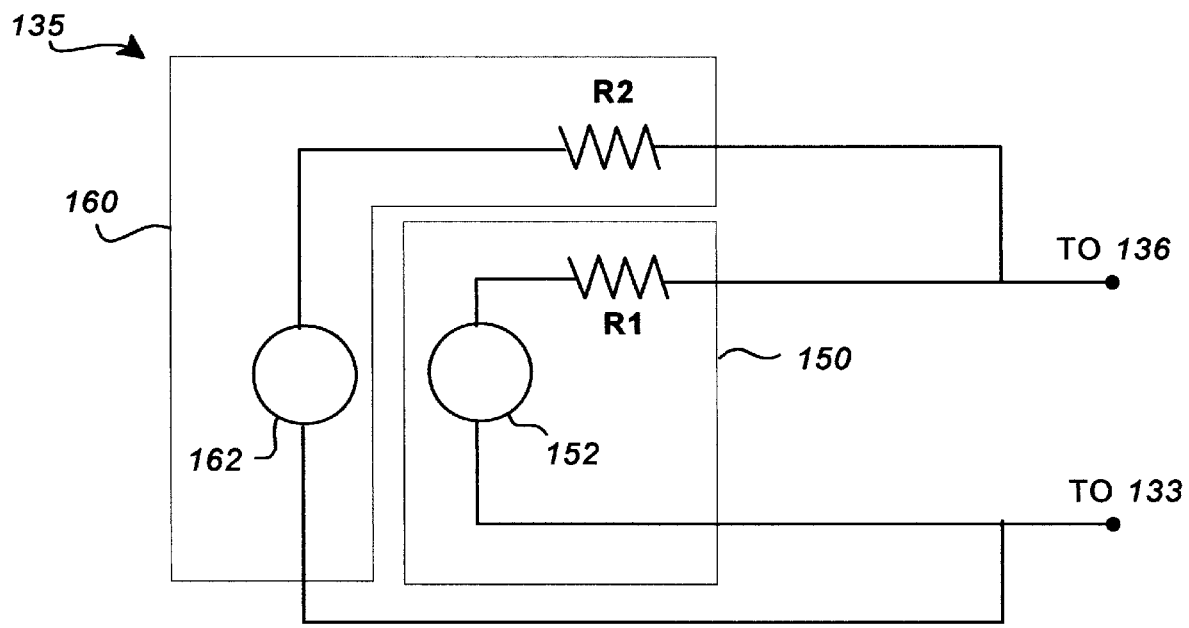
FIG. 4 is a schematic diagram of an illustrative embodiment of a plasma energizing circuit used in the wire bonder of the invention.
Figure 5:
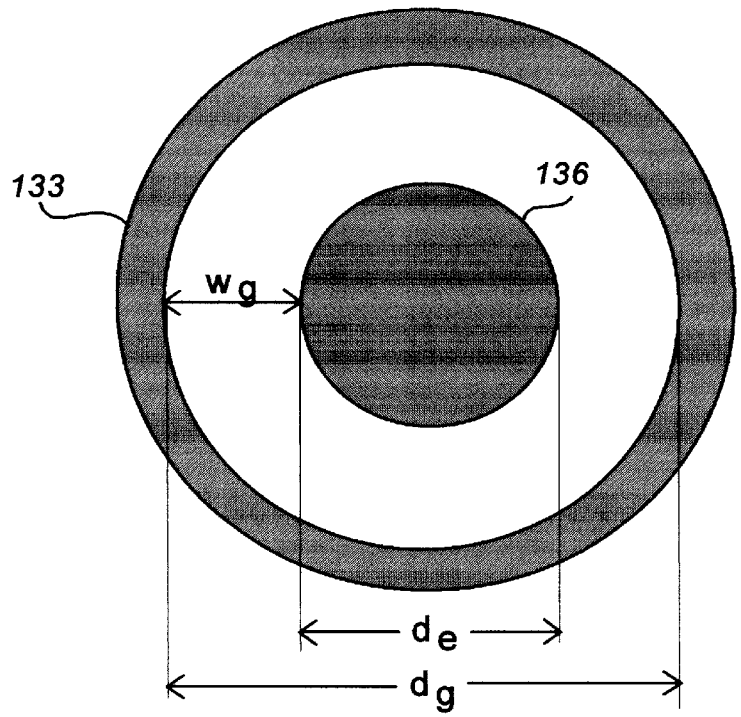
FIG. 5 is a concentric view of a preferred embodiment of the plasma gun used in the wire bonder of the invention.

FIG. 4 is a schematic diagram of an illustrative embodiment of the plasma energizing circuit 135 that serves to ionize the argon to form hot plasma. In the illustrative embodiment, energizing circuit 135 uses direct current techniques to energize the gas, and includes an ionization initiation circuit 150 and a high-current circuit 160. Ionization circuit 150 is a high impedance/high voltage power supply which is schematically represented with a DC power supply 152 and a resistor R1. Central electrode 136 has a diameter $d_e$ which is a predetermined length less than the diameter $d_g$ of the inner coaxial hollow bore 132. Electrode 136 is arranged coaxially within hollow bore 132, such that a hollow gap $w_g$ is formed concentrically and of even width around the electrode 136 along the coaxial axis. Gap width $w_g$ is defined by $d_g-d_e$, preferably at every point around the coaxial axis. This is illustrated more clearly in FIG. 5, which is a schematic diagram of an illustrative embodiment of the plasma energizing circuit.

Ionization circuit 150 is a high-voltage, low-current-limited series circuit, which yields high potential across the argon stream flowing through the hollow bore 132 between the electrode 136 and plasma gun walls 133. The design of the ionization is such that it delivers a high enough electric potential across the argon gap $w_g$ to result in ionization of the argon atoms as they pass through the gap. It will be appreciated by those skilled in the art that although ionization is achieved using a high-voltage, low-current-limited circuit, the temperature of the argon gas flowing out the tip 130 of the plasma gun and onto the surface of the bond site is still relatively low due to the limited power delivered to the gas across the gap $w_g$.

Accordingly, high-current circuit 160 is provided to maintain sufficient heat so as to allow the argon atoms to clean the surfaces of the bond site, capillary wedge tip 120, and wire 118. In the illustrative embodiment, high-current circuit 160 is coupled in parallel with ionization circuit 150, and comprises a DC power supply 162 with a source impedance R2 (<<R1) between central electrode 136 and the outer wall 133 of plasma gun 104. High-current circuit 160 is a low-voltage power source which yields high power across the gap $w_g$ in which the argon stream flows through the hollow bore 132 between the electrode 136 and plasma gun walls 133. The high-current circuit 160 delivers lower voltage across the gap due to the drop in impedance of the ionized gas. This second power supply circuit 160 delivers the bulk of the energy to the gas.

As an illustrative example, if power supply 152 is a 20 KV DC supply and R1 is 1 Mohm (which limits the current to 20 mA). The resistance of the argon across the gap is large before ionization. However, suppose that upon ionization the gap impedance drops to 2 Ohms. In this example, since power is defined as $P=I*V$, and $V=I/R$, $P=I^2*R$, the power seen across gap $w_g$ is $P=I^2*R=(20\text{ mA})^2*2\text{ Ohms}=800\times10^{-6}$ W, which, as known by those skilled in the art, is not enough power to raise the temperature of the bonding surface heated by the ionized gas to a level sufficient to perform surface cleaning and bonding. Accordingly, the design of the high-current circuit 160 may be such that power supply 162 is 20 V DC and R1 is 2 Ohms (which limits the current to 10 A). Again, if the resistance across the gap is 2 ohms, the power delivered across gap $w_g$ is $P=I^2*R=(10\text{ A})^2*2\text{ Ohms}=200$ W, which is enough power to raise the temperature of the gas atoms to a level sufficient to perform surface cleaning and bonding.

A critical factor in successful plasma cleaning is the choice of a process gas. If the correct gas is chosen, optimum contaminant removal is achieved, and the potential for undesirable substrate oxidation is minimized. Although the invention has been described using argon gas or an argon/oxygen mixture, other suitable gasses or gaseous mixtures may also be employed. Some other exemplary gases, such as hydrogen H2 or carbon tetra-fluoride $CF_4$, possess desirable characteristics for plasma cleaning. Gas selection may vary according to cleaning requirements for a specific substrate, contaminant, application, or process.

Figure 6:
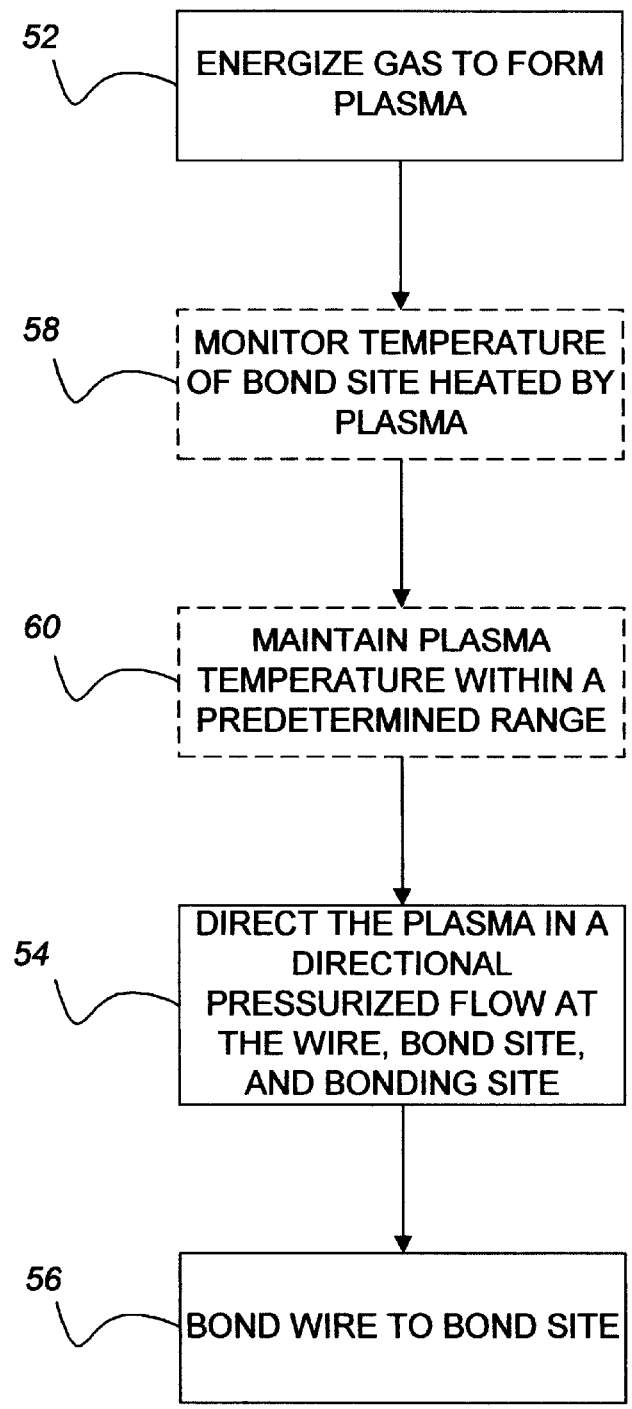
FIG. 6 is an operational flowchart of a method for simultaneously cleaning and bonding wires to bond sites implemented in accordance with the invention.

FIG. 6 is an operational flowchart of a method in accordance with the invention for simultaneously cleaning and bonding wires to bond sites. In accordance with the method of the invention, a gas is energized 52 to form a plasma. The plasma is directed 54 in a directional pressurized flow at the wire and the bonding site surface (and preferably the portion of the bonding device that comes into contact with the portions of the wire and bonding site surface that are to be bonded) to form a plasma cleaning chamber bubble around the portion of the wire and bonding surface that are to be bonded together. The respective portions of the wire and the bonding site surface are then bonded 56 together within the plasma cleaning chamber bubble. Preferably, the temperature of the bond site heated by the plasma/hot gas is monitored 58 and maintained 60 within a predetermined range (e.g., 170° F. to 190° F.).

The present invention as described in detail above is advantageous over the prior art in several respects. First, the metal surfaces are cleaned as they are bonded to eliminate any contaminants from being introduced into the final bond, thereby improving the wire bond adhesion. Secondly, because the temperature of the plasma/hot gas as it hits the surfaces of the bond site is high enough (typically 180° F.), the bonding device itself need not necessarily include a heater, thereby providing "localized" heating to reduce the risk of accidentally unsoldering other wire bonds on the device being bonded.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. A plasma enhanced wire bonder for bonding a wire to a bond surface, comprising:
   a bonding device which bonds said wire to said bond surface;
   a plasma gun which applies a pressurized directional flow of plasma directed at said wire and said bond surface to simultaneously heat and clean said wire and said bond surface during bonding of said wire to said bond surface.

2. A plasma enhanced wire bonder in accordance with claim 1, comprising:
   an energizing circuit which energizes a gas supplied to said plasma gun to generate said plasma.

3. A plasma enhanced wire bonder in accordance with claim 2, comprising:
   a gas source which supplies said gas to said plasma gun.

4. A plasma enhanced wire bonder in accordance with claim 2, wherein:
   said gas comprises a combination of one or more gases which together perform one or more of vaporization, reduction, and/or oxidizing cleaning.

5. A plasma enhanced wire bonder in accordance with claim 4, wherein:
   said gas comprises a noble gas for performing vaporization cleaning.

6. A plasma enhanced wire bonder in accordance with claim 4, wherein:
   said gas comprises a recombinant gas for performing reduction cleaning.

7. A plasma enhanced wire bonder in accordance with claim 4, wherein:
   said gas comprises a recombinant gas for performing oxidizing cleaning.

8. A plasma enhanced wire bonder in accordance with claim 1, wherein:
   said bonding device is a wedge bonder.

9. A plasma enhanced wire bonder in accordance with claim 1, wherein:
   said bonding device is a ball bonder.

10. A plasma enhanced wire bonder in accordance with claim 2, wherein:
    said energizing circuit generates said plasma via direct current voltage.

11. A plasma enhanced wire bonder in accordance with claim 2, wherein:
    said energizing circuit generates said plasma via radio frequency.

12. A plasma enhanced wire bonder in accordance with claim 11, wherein:
    said radio frequency is in the range of 1 KHz to 100 GHz.

13. A plasma enhanced wire bonder in accordance with claim 2, wherein:
    said energizing circuit comprises:
    a high voltage DC circuit that sparks an initial ionization of the gas within the plasma gun; and
    a secondary low-voltage, high-current DC circuit that continues the ionization of the gas once the initial ionization spark begins and supplies the bulk of the energy to said gas.

14. A plasma enhanced wire bonder in accordance with claim 13, wherein:
    said ionization of the gas occurs periodically to form a periodic output stream of hot pulses (or "bullets") of plasma.

15. A plasma enhanced wire bonder in accordance with claim 2, comprising:
    a temperature detector which remotely senses the temperature of the bond surface; and
    a controller coupled to receive said sensed temperature and to control said energizing circuit to maintain said temperature of said bond surface within a predetermined temperature range.

16. A plasma enhanced wire bonder in accordance with claim 15, comprising:
    a pulse width modulator coupled to the controller which controls the energizing circuit to maintain said temperature of said bond surface within said predetermined temperature range.

17. A method for bonding a wire to a bonding surface, said method comprising:
    energizing a gas to form a plasma;
    directing said plasma in a directional pressurized flow at said wire and said bonding surface, so as to form a plasma cleaning chamber bubble around the portion of said wire and said bonding surface that are to be bonded together to simultaneously heat and clean said wire and said bond surface during bonding of said wire to said bond surface; and
    bonding together said respective portions of said wire and said bonding surface while said plasma cleaning chamber bubble exists.

18. A method in accordance with claim 17, wherein:
    said plasma cleaning chamber bubble is also formed around a portion of a bonding device that comes in contact with said portion of said wire or said portion of said bonding surface that are to be bonded together.

19. A method in accordance with claim 17, comprising:
    monitoring a temperature of said bonding surface;
    maintaining said temperature of said bonding surface within a predetermined range.

20. A method in accordance with claim 17, comprising:
    monitoring the temperature of said plasma;
    maintaining said temperature of said plasma within a predetermined range.

* * * * *